United States Patent [19]
Webb, Jr.

[11] 4,042,881
[45] Aug. 16, 1977

[54] VOLTAGE MEASURING DEVICE HAVING AN AMPLIFIER IN THE PROBE

[75] Inventor: William Webb, Jr., Denver, Colo.

[73] Assignee: Unitec, Inc., Denver, Colo.

[21] Appl. No.: 589,297

[22] Filed: June 23, 1975

[51] Int. Cl.² ............... G01R 1/30; G01R 15/08; G01R 1/06
[52] U.S. Cl. .................... 324/123 R; 324/72.5; 324/115
[58] Field of Search .............. 324/115, 72.5, 123 R, 324/149, 72

[56] References Cited
U.S. PATENT DOCUMENTS

| | | | |
|---|---|---|---|
| 3,502,981 | 3/1970 | Teer et al. | 324/123 R |
| 3,828,256 | 8/1974 | Liu | 324/123 R |

OTHER PUBLICATIONS
Osipov, A. K.; Semiconductor Electrometric Amplifiers; Instru. Exp. Tech. (U.S.A.); Jan.-Feb., 1971; pp. 1-11.
Bohr, E.; "A No-Load Signal Probe;" Radio and Television News; June 1956; pp. 68, 69, 154, 155.

*Primary Examiner*—Rudolph V. Rolinec
*Assistant Examiner*—Ernest F. Karlsen
*Attorney, Agent, or Firm*—O'Rourke, Harris & Hill

[57] ABSTRACT

An electrical quantity measuring device is disclosed that includes a probe unit presenting high impedance, which device is suitable for measuring voltage. The components of the measuring device, except for the probe unit, are housed in a cabinet having a meter mounted thereon for external viewing. The probe unit has a contactor and provides an output signal indicative of the predetermined quantity of an element to be measured during contact of the element with the contactor and a ground lead. A high impedance between the contactor and the probe output is provided by a plurality of field effect transistors, and an operational amplifier, the gate of the first of which transistors is connected with the contactor and the gate of the second of which receives a feedback signal from the processing circuitry of the measuring device within the cabinet. A third field effect transistor is connected with the first field effect transistor and compensates for leakage current. The processing circuitry of the measuring device includes a pair of series connected transistors with the junction at the output side of the transistors providing an output signal suitable for scope usage and also providing the feedback signal to the high impedance section of the probe unit. The output from the processing circuitry is also coupled through range selection switching circuitry and driving circuitry to a meter as well as to indicating circuitry for indicating the polarity of a reading on the meter.

6 Claims, 3 Drawing Figures

VOLTAGE MEASURING DEVICE HAVING AN AMPLIFIER IN THE PROBE

FIELD OF THE INVENTION

This invention relates to a measuring device and, more particularly, relates to a voltage measuring device that includes a probe unit presenting high impedance.

BACKGROUND OF THE INVENTION

In research, manufacture, and electrical equipment operation, it is oftentimes necessary that accurate measurement of electrical quantities, such as current, voltage, and/or resistance, be made. The basic methods for current, voltage, and impedance or resistance measurement have heretofore been developed and are well-known, as are various devices for effecting such measurements. Included among such devices are indicating instruments, such as D'Arsonval instruments to measure direct currents and voltages, moveable-iron-vane instruments for measuring alternating currents and voltages, and electronic volt-ohm-ammeters for measuring voltage, current, and resistance, for example. While such devices have proved to be acceptable for some desired measurements, none of the devices herefore known and/or utilized have proved to be successful for at least some desired measurements, and more particularly in making measurements where high impedance is necessary in the probe unit of the measuring device to measure voltage.

SUMMARY OF THE INVENTION

This invention provides an improved measuring device for measuring electrical quantities and includes a probe unit having a means for effecting high impedance.

It is therefore an object of this invention to provide an improved measuring device.

It is another object of this invention to provide an improved device for measuring voltage.

It is still another object of this invention to provide an electrical quantity measuring device having a probe unit presenting a high impedance.

It is still another object of this invention to provide an improved probe unit.

It is yet another object of this invention to provide an improved probe unit having high impedance.

It is still another object of this invention to provide an improved voltage measuring device with a probe unit having a plurality of field effect transistors to provide high impedance.

It is yet another object of this invention to provide an improved electrical quantity measuring device wherein a high impedance section of a probe unit receives a feedback signal from processing circuitry of the measuring device.

It is yet another object of this invention to provide an improved voltage measuring device having a probe unit with a plurality of field effect transistors and providing leakage compensation.

It is yet another object of this invention to provide an improved voltage measuring device with a meter and means for indicating polarity of a reading on said meter.

With these and other objects in view, which will become apparent to one who is skilled in the art as the description proceeds, this invention resides in the novel construction, combination, and arrangement of parts substantially as hereinafter described, and more particularly defined by appended claims, it being understood that such changes in the precise embodiment of the hereindisclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which.

DESCRIPTION OF THE INVENTION

Figure 1:
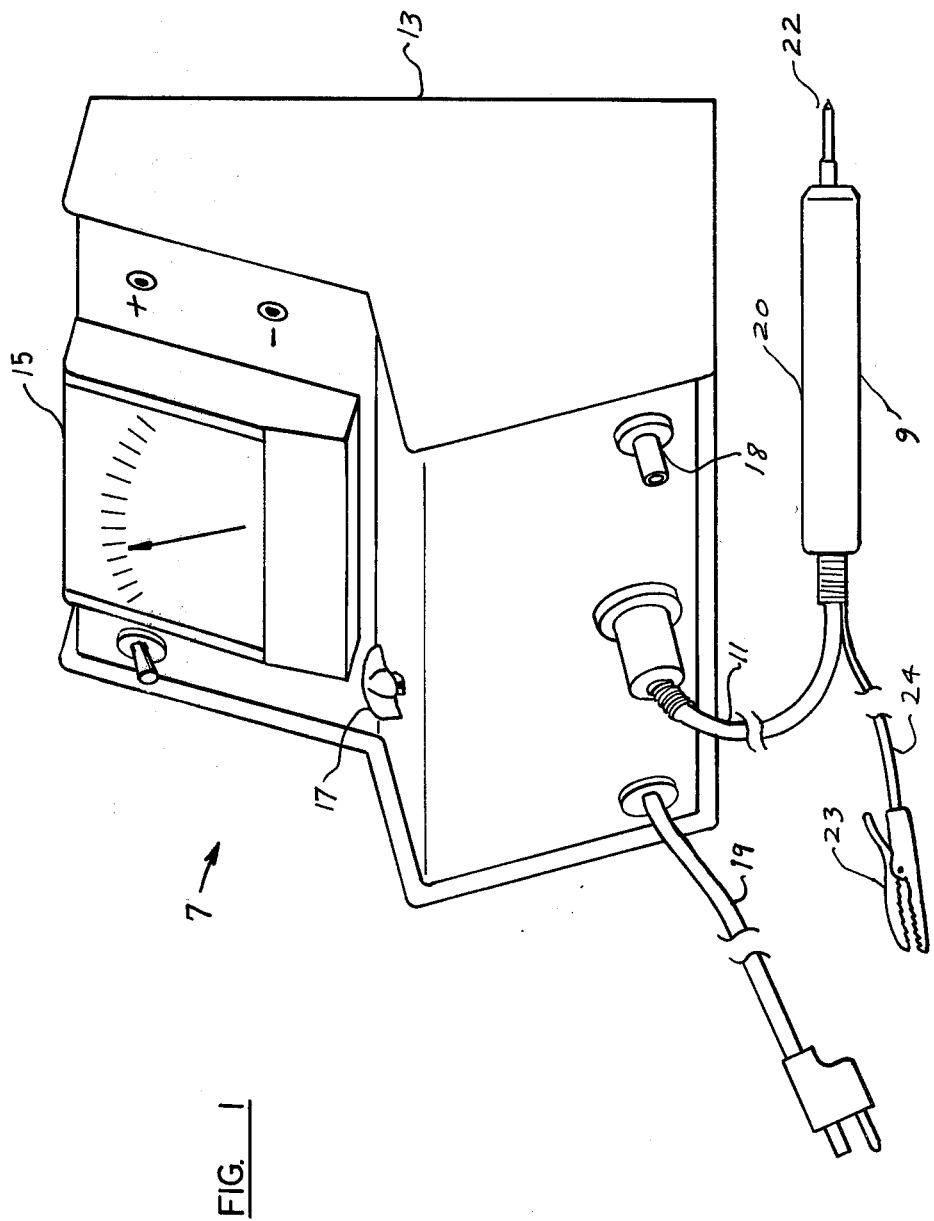
FIG. 1 is a perspective view of the voltage measuring device of this invention.

Referring to the drawings, the numeral 7 indicates the voltage measuring device of this invention and includes probe unit 9 connected by multi-wire cable 11 to the remainder of the circuitry of the measuring device, which circuitry is shown in FIG. 1 to be housed in cabinet 13. As indicated, cabinet 13 has a meter (ammeter) 15 mounted thereon for external viewing and a range selection switch 17, as well as an outlet 18 for connecting the measuring device output to a scope (oscilloscope) and power cord 19.

Probe unit 9 may be relatively small in size and, as indicated in FIG. 1, may have a small diameter housing 20 so that a probe can be conventionally hand held. The circuit includes, as is common, a contacting element, or contactor, 22 as well as a ground connection and lead 23 and 24, respectively, as shown in FIG. 1. The contactor element 22 extends into housing 20 at the probe unit, which housing is preferably of insulating material (or is at least insulated from the contactor element 22), and the contactor is electrically connected within the housing 20 to the high impedance section 26 of the probe unit, as indicated in FIG. 2.

Figure 2:
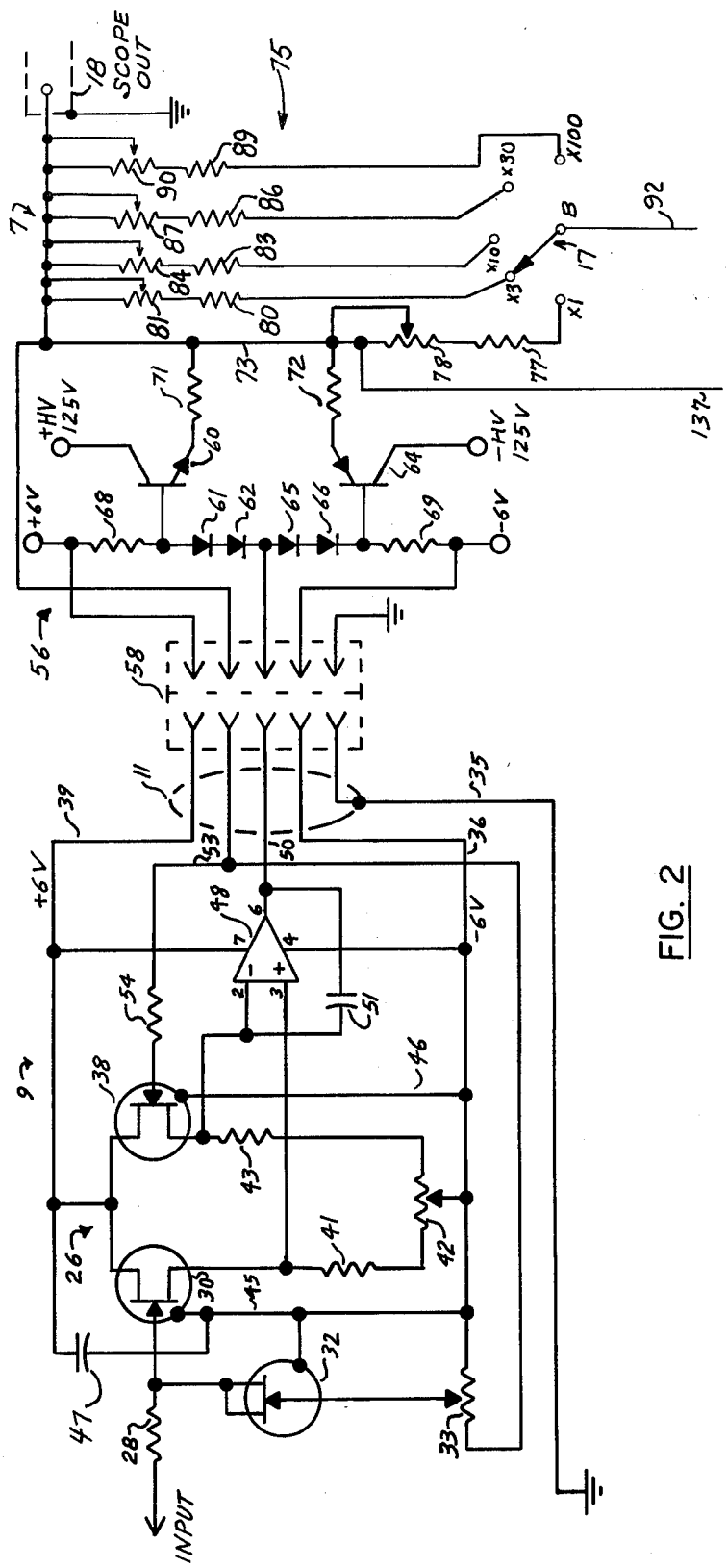
FIGS. 2 and 3 taken together form an electrical schematic diagram of the voltage measuring device shown in FIG. 1.

As shown in FIG. 2, the input (contactor element 22) is connected through resistor 28 to the gate of field effect transistor 30. The junction of resistor 28 and the gate of field effect transistor 30 is connected to the source and drain electrodes of field effect transistor 32, the gate of which field effect transistor is connected to the moveable tap of potentiometer 33. Potentiometer 33 is connected between lead 53 and a −6 volt power supply through lead 36. Lead 35 is a ground lead.

The drain electrode of field effect transistor 30 and the drain electrode of field effect transistor 38 are commonly connected to the +6 volt power supply through lead 39. A source electrode of field effect transistor 30 is connected through resistor 41 to one side of potentiometer 42, while the source electrode of field effect transistor 38 is connected through resistor 43 to the other side of potentiometer 42, with the moveable tap of potentiometer 42 being connected to lead 36. In addition, a lead 45 is connected between the casing of field effect transistor 30 and lead 36 with lead 45 also being connected to the casing of field effect transistor 32 and to lead 39 through capacitor 47. In addition, lead 46 is connected between the casing of field effect transistor 38 and lead 36.

A source electrode of field effect transistor 30 is connected with the positive input (pin 3) of operational amplifier 48, while the source electrode of transistor 38 is connected to a negative input (pin 2) of the operational amplifier. Pin 7 of the operational amplifier 48 is connected to the +6 volt power source (lead 39) while pin 4 is connected to the −6 volt power source (lead 36).

The output from the probe unit is taken from the output of operational amplifier 48 and coupled therefrom on lead 50. A capacitor 51 is connected between the output of the operational amplifier and the negative input lead (pin 2). A feedback signal to the high impedance section of the probe unit is coupled on lead 53 through resistor 54 to the gate of field effect transistor 38.

As can be seen from FIG. 2, cable 11 includes leads 35, 36, 39, 50 and 53 which are coupled to corresponding leads in the processing circuitry 56 of the measuring device through connector 58.

The output signal from the probe unit on lead 50 is coupled to the base of transistor 60 in processing circuitry 56 through diode 61 and 62, and to the base of transistor 64 through diodes 65 and 66. The bases of transistor 60 and 64 are also connected with the +6 volt power and the −6 volt power supplies, through resistor 68 and 69, respectively.

The collector of transistors 60 and 64 are connected to the +125 volt and −125 volt high voltage power supplies, respectively, while the emitters of transistors 60 and 64 are connected through resistors 71 and 72, respectively, to output junction 73. Output junction 73 is connected with scope output 18 and provides a signal suitable for an oscilloscope presentation as an indication of the voltage measured.

Junction 73 is also connected with range selector circuitry 75, which includes range selector switch 17. The various contacts of switch 17 are connected to junction 73 through series resistance combinations with the X1 contact being connected through resistor 77 and potentiometer 78, the X3 connection being connected through resistor 80 and potentiometer 81, the X10 connection being through resistor 83 and potentiometer 84, the X30 connection being through resistor 86 and potentiometer 87, and the X100 connection being through resistor 89 and potentiometer 90.

The moveable contactor of switch 17 is connected through lead 92 to the meter driving circuitry 94, and more particularly, to the negative input (pin 6) of operational amplifier 95. The positive input (pin 5) of operational amplifier 95 is connected with ground through resistor 96, and the negative input (pin 6) is connected to one side of diodes 98 and 99, the other side of which diodes are connected to ground.

The output from operational amplifier 95 is taken from pin 7 through resistor 101 to the positive input (pin 5) of operational amplifier 102 and through resistor 104 to the negative input (pin 2) of operational amplifier 105. Operational amplifiers 102 and 105 form preferably a single chip integrating circuit as do operational amplifiers 95 and 106, the latter of which is part of the polarity indicating circuitry 108. Pin 7 of operational amplifier 95 is connected with the negative input (pin 6) through resistor 110.

The output (pin 7) of operational amplifier 102 is coupled through diode 112 and resistor 113 to meter 15, while the output (pin 1) of operational amplifier 105 is connected to meter 15 through diode 114 and resistor 113. In addition, the negative input (pin 6) of operational amplifier 102 is connected to the junction of diode 112 and resistor 113 through resistor 116, while the negative input (pin 2) of operational amplifier 105 is connected to the junction of diode 114 and resistor 113 through resistor 117. The positive input (pin 3) of operational amplifier 105 is connected with ground through resistor 118.

The polarity indicating circuitry 108 includes operational amplifier 106, and the negative input (pin 2) of circuit 106 is connected to the output (pin 7) of operational amplifier 95. The output from operational amplifier 106 is coupled through resistor 120 to the bases of transistors 122 and 123. The collectors of transistors 122 and 123 are connected through resistors 125 and 126, respectively, to one side of LED 127 and 128, respectively, the other sides of which are connected to the +15 volt and −15 volt power supplies, respectively.

The power supply 130 includes transformers 132, 133, and 134 each having a primary winding connected with a conventional AC power supply such as 110 volt 60 Hz power supply. The secondary winding 136 of transformer 132 has a center tap which is connected with junction 73 of processing circuitry 56 through lead 137. This permits the probe power supply voltage of −6 volts and +6 volts to follow the output at junction 73.

A diode 139 is connected to one side of secondary winding 136 and has a series connected resistor 140 connected thereto. The junction of diode 139 and resistor 140 is connected to one side of capacitor 141, the other side of which capacitor is connected to the center tap of secondary winding 136. A Zener diode 143 and capacitor 144 are connected in parallel between the junction of resistor 140 and the +6 volt output and the center tap of secondary winding 136.

The other side of secondary winding 136 is connected in like manner to supply the −6 volt power. As shown, the secondary winding is connected through series connected diode 146 and resistor 147 to the −6 volt output, and capacitor 149 is connected between the junction of diode 146 and resistor 147 and the center tap of secondary winding 136. In addition, parallel connected Zener diode 151 and capacitor 152 are connected between the −6 volt power output and the center tap of secondary winding 136.

Figure 3:
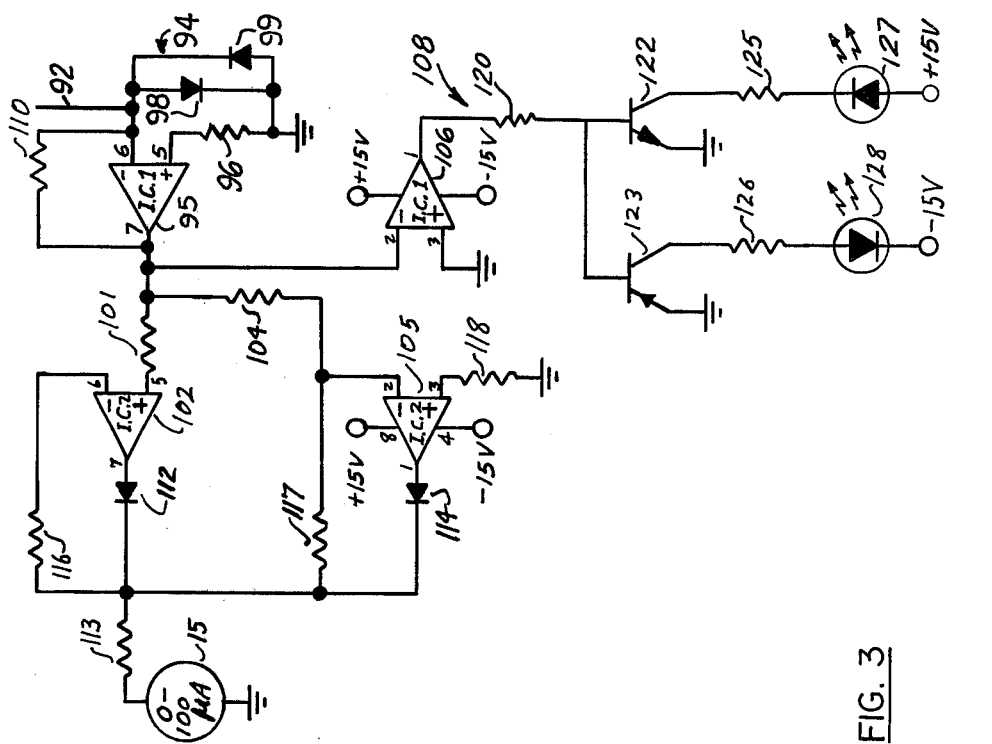
Figure 3:
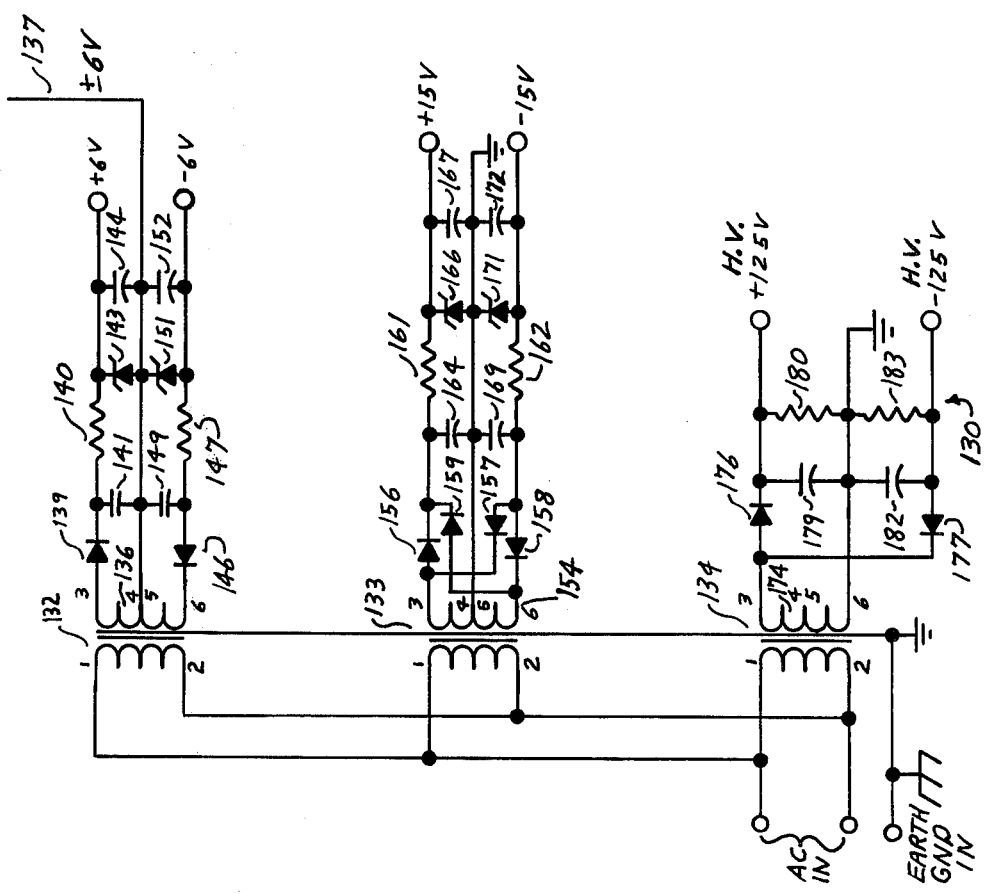

The secondary winding 154 of transformer 133 is likewise center tapped, but the center tap is grounded as shown in FIG. 3. One side of secondary winding 154 is connected to one side of diodes 156 and 157 while the other side of secondary winding 154 is connected to one side of diodes 158 and 159, which diodes together with diodes 156 and 157 make up a diode rectifying bridge. The other side of diodes 156 and 159 are connected through resistor 161 to the +15 volt power output, while the other side of diodes 157 and 158 are connected through resistor 162 to the −15 volt power output. One side of resistor 161 is connected to ground through capacitor 164 while the other side is connected to ground through parallel connected Zener diode 166 and capacitor 167. In like manner, one side of resistor 162 is connected to ground through a capacitor 169 and the other side is connected with ground through Zener diodes 171 and capacitor 172.

The secondary winding 174 of transformer 134 has one side connected to series connected diodes 176 and 177 leading to the +125 volt and −125 volt outputs, while the other side of secondary winding 174 is connected with ground. Parallel connected capacitor 179 and resistor 180 are connected to the cathode of diode 176, while parallel connected capacitor 182 and resistor 183 are connected to the anode of diode 177.

In a working embodiment of the invention, the following components were utilized, it being meant to be realized that the listing of components is for illustration only and the invention is not meant to be limited thereto. The components are as follows:

Resistors (ohms):

28 — 22M; 33 — 0 to 250K; 41 — 330K; 42 — 0 to 250K;
43 — 330K; 54 — 22M; 68 + 69 — 47K; 71 + 72 — 4.7k;
77 — 9.1K; 78 — 0 to 2K; 80 — 22K; 81 — 0 to 20K;
83 — 91K; 84 — 0 to 20K; 86 — 220K; 87 — 0 to 250K;
89 — 910K; 90 — 0 to 250K; 96 — 4.7K; 101 + 104 — 10K;
110 — 100K; 113 — 100K; 116 — 10K; 117 — 10M; 118 — 4.7K;
120 — 10K; 125 — 2.7K; 126 — 2.7K; 140 — 1K; 147 — 1K;
161 + 162 — 330; 180 + 183 — 1M.

Capacitors:

47 and 51 — 0.1MF; 141 — 50MF; 144 — 33MF; 149 — 50MF; 152 — 33MF;
164 — 50MF; 167 — 33MF; 169 — 50MF; and 172 — 33MF; and
179 + 182 — 50MF.

Zener Diodes:

143 + 151 — 6.2V; 166 + 171 — 15V.

Diodes:

61, 62, 65 + 66 — 1N4148; 98 + 99 — 1N4148; 112 + 114 — 1N4148;
139 — 1N4004; 146 — 1N4004; 156, 157, 158, + 159 — 1N4004; and
176 + 177 — 1N4004.

Transistors:

60 — 2N3440; 64 — 2N5416; 122— 3904; and
123 — 3906.

FET:

30 + 32 + 38 — 2N4117A.

Integrated Circuits:

48 — 741
95 + 106 — 741; 102 + 105 — 741.

Transformers:

132 + 133 — PW9006; 134 — PW9012.

In operation, as the input voltage increases, the source voltage of FET 30 increases. This is applied to the positive input (non-inverting) of operational amplifier 48. The output from operational amplifier 48 goes high and this turns on transistor 60 and turns off transistor 64. Junction 73 then goes in a more positive direction. The feedback from junction 73 is applied to the gate of FET 38 which raises the source voltage of FET 38 until it balances (i.e., is equal to) the source voltage of FET 30. At this point, the voltage at junction 73 is equal to the input voltage at the probe input.

Should the probe input voltage decrease, the opposite occurs, i.e., the source of FET 30 goes down to turn on transistor 64 and turn off transistor 60. This reduces the voltage at junction 73 and lowers the source voltage of FET 38 to thus bring about the voltage balance to operational amplifier 48. Potentiometers 33 and 42 are adjusted to compensate for leakage current and offset voltage, respectively.

When the contactor 22 is in contact with an element the voltage of which is to be measured, the output produced at the probe unit output on lead 50 is indicative of the voltage measured and a high impedance is presented in the probe unit.

The output on lead 50 is coupled to the processing circuitry and an output is produced from transistors 60 and 64 (depending on the polarity of signal) and this output is coupled to junction 73. The junction is connected with the scope output so that a signal coupled thereto is indicative of the voltage measured and is suitable for scope presentation.

The range selection switch is adjusted as needed and a signal being from junction 73 is coupled through the range selection circuitry and the meter driving circuitry to meter 15, with the signal coupled through operational amplifier 102 or 105, again depending upon signal polarity. The polarity indicating circuitry indicates polarity depending upon whether it passes through LED 127 or LED 128.

In view of the foregoing, it can be appreciated that the electrical quantity measuring device of this invention provides an improved voltage measuring device having a probe unit that presents high impedance.

What is claimed is:

1. A voltage measuring device, comprising:
a probe unit having input means, output means, and means including a plurality of field effect transistors and an operational amplifier electrically connected with said input means and presenting a high impedance, said input means including a contactor for contacting an element the voltage of which is to be measured, and said output means providing an output voltage indicative of a voltage measured during contact of said contactor of said input means with said element;
conductor means connected with said output means of said probe unit; and
electrical signal processing means receiving said output voltage from said probe unit through said conductor means and providing an output suitable for use at a utilization means to indicate signal voltage measured, said electrical processing means including a pair of transistors connected in series with one another with the output of said electrical signal processing means being taken from a junction receiving the outputs from said transistors, said output from said electrical signal processing means also being fed back through said conductor means and providing an output suitable for use at a utilization means to indicate said voltage measured, said output from said electrical signal processing means also being fed back through said conductor means to said high impedance means of said probe unit.

2. The measuring device of claim 1 wherein one of said field effect transistors is connected with said input means and another of said field effect transistors receives the signal fed back from said electrical signal processing means.

3. The measuring device of claim 2 wherein a third one of said field effect transistors is connected with said one field effect transistor to compensate for leakage current.

4. The measuring device of claim 1 wherein said device includes means for providing an output connectable with a scope to indicate said voltage measured.

5. The measuring device of claim 1 wherein said device includes range selection means, driving means, meter means, and polarity indicating means, said driving means being connected through said range selection means to receive the output from said electrical signal processing means and providing an output to said meter means and an indication of the polarity of said output to said meter means to said polarity indicating means.

6. The measuring device of claim 1 wherein said device includes power supply means having a transformer with the secondary winding thereof having a center tap which is connected to said electrical signal processing means.

* * * * *